United States Patent [19]

Dean

[11] Patent Number: 5,794,685
[45] Date of Patent: Aug. 18, 1998

[54] HEAT SINK DEVICE HAVING RADIAL HEAT AND AIRFLOW PATHS

[75] Inventor: Ronald P. Dean, Fort Collins, Colo.

[73] Assignee: Hewlett-Packard Company, Palo Alto, Calif.

[21] Appl. No.: 768,906

[22] Filed: Dec. 17, 1996

[51] Int. Cl.[6] .................................................... H05K 7/20
[52] U.S. Cl. ........................ 165/121; 165/80.3; 361/697
[58] Field of Search ............................... 165/80.3, 185, 165/121; 361/697, 704, 707, 710

[56] References Cited

U.S. PATENT DOCUMENTS

| | | | |
|---|---|---|---|
| 2,936,409 | 5/1960 | Jackson et al. | 165/80.3 X |
| 3,220,471 | 11/1965 | Coe | 165/80.3 X |
| 3,262,028 | 7/1966 | Hermann | 165/80.3 X |
| 3,366,171 | 1/1968 | Scharli | 165/80.3 |
| 3,566,958 | 3/1971 | Zelina | 165/80.3 |
| 3,686,533 | 8/1972 | Garnier et al. | 317/100 |
| 3,727,114 | 4/1973 | Oshima | 165/80.3 X |
| 4,194,556 | 3/1980 | Watanabe et al. | 165/51 |
| 4,233,644 | 11/1980 | Hwang et al. | 361/384 |
| 4,489,363 | 12/1984 | Goldberg | 361/383 |
| 4,541,004 | 9/1985 | Moore | 357/81 |
| 4,546,405 | 10/1985 | Hultmark et al. | 361/386 |
| 4,611,238 | 9/1986 | Lewis et al. | 357/81 |
| 4,620,216 | 10/1986 | Horvath | 357/81 |
| 4,639,829 | 1/1987 | Ostergren et al. | 361/386 |
| 4,662,830 | 5/1987 | Pottebaum | 417/424 |
| 4,682,651 | 7/1987 | Gabuzda | 165/80.3 |
| 4,715,430 | 12/1987 | Arnold et al. | 165/80.3 |
| 4,733,293 | 3/1988 | Gabuzda | 357/81 |
| 4,812,733 | 3/1989 | Tobey | 323/285 |
| 4,970,579 | 11/1990 | Aridt et al. | 357/81 |
| 5,000,254 | 3/1991 | Williams | 165/85 |
| 5,019,880 | 5/1991 | Higgins, III | 357/81 |
| 5,029,236 | 7/1991 | Yasuda et al. | 455/90 |
| 5,191,330 | 3/1993 | Heung | 307/141 |
| 5,272,599 | 12/1993 | Koenen | 361/710 |
| 5,287,249 | 2/1994 | Chen | 361/718 |
| 5,288,203 | 2/1994 | Thomas | 415/178 |
| 5,297,617 | 3/1994 | Herbert | 165/80.3 |
| 5,299,632 | 4/1994 | Lee | 165/80.3 |
| 5,309,983 | 5/1994 | Bailey | 165/80.3 |
| 5,335,722 | 8/1994 | Wu | 165/80.3 |
| 5,353,863 | 10/1994 | Yu | 165/122 |
| 5,484,262 | 1/1996 | Thomas et al. | 415/178 |

FOREIGN PATENT DOCUMENTS

| | | | |
|---|---|---|---|
| WO 93/08600 | 4/1993 | European Pat. Off. | |
| 1206000 | 2/1960 | France | 165/80.3 |
| 27 43 708 A | 4/1979 | Germany | |
| 63-113460 | 7/1988 | Japan | |
| 2-286900 | 11/1990 | Japan | |
| 3-229492 | 10/1991 | Japan | |

OTHER PUBLICATIONS

R. Mitchell, "the Experimental Step 486/50 Redefines Cool," BYTE, Dec. 1990.

*Primary Examiner*—Allen J. Flanigan

[57] ABSTRACT

A heat sink device is disclosed which provides a large surface area in order to facilitate heat transfer into the surrounding air and which also allows cooling air to impinge directly upon the integrated circuit device being cooled. The heat sink device is constructed having a relatively large central region which is adapted to contact the integrated circuit device. This large central region facilitates conduction of heat from the integrated circuit device into the heat sink device. Extending outwardly from the central region are a plurality of cooling fins which facilitate the conduction of heat out of the central region and which provide a large surface area to enhance heat transfer into the surrounding air.

15 Claims, 4 Drawing Sheets

HEAT SINK DEVICE HAVING RADIAL HEAT AND AIRFLOW PATHS

FIELD OF THE INVENTION

The present invention relates generally to cooling devices and, more particularly, to a cooling device for removing heat from an integrated circuit device.

BACKGROUND OF THE INVENTION

Integrated circuit devices are increasingly being used in modern electronic applications. One prevalent example is the computer. The central processing unit or units of most computers, including personal computers, is constructed from an integrated circuit device.

During normal operation, integrated circuit devices generate significant amounts of heat. If this heat is not continuously removed, the integrated circuit device may overheat, resulting in damage to the device and/or a reduction in operating performance. In order to avoid such overheating, integrated circuit cooling devices are often used in conjunction with integrated circuit devices.

One such cooling device is a fan assisted heat sink cooling device. In such a device, a heat sink is formed of a material, such as aluminum, which readily conducts heat. The heat sink is usually placed on top of and in contact with the integrated circuit device. Due to this contact, heat generated by the integrated circuit is conducted into the heat sink and away from the integrated circuit.

The heat sink may include a plurality of cooling fins in order to increase the surface area of the heat sink and, thus, maximize the transfer of heat from the heat sink device into the surrounding air. In this manner, the heat sink draws heat away from the integrated circuit and transfers the heat into the surrounding air.

In order to enhance the cooling capacity of such a heat sink device, an electrically powered fan is often mounted on top of the heat sink. Examples of fan assisted heat sink devices are described in U.S. patent application Ser. No. 08/593,185, filed Feb. 1, 1996, of Guy R. Wagner for FAN ASSISTED HEAT SINK DEVICE and U.S. application Ser. No. 08/676,602, filed Jul. 3, 1996, of Arlen L. Roesner, Guy R. Wagner and Samuel M. Babb for ELECTRONIC DEVICE ENCLOSURE HAVING ELECTROMAGNETIC ENERGY CONTAINMENT AND HEAT REMOVAL CHARACTERISTICS, which are hereby incorporated by reference for all that is disclosed therein.

Over the years, as the power of integrated circuit devices has increased, so has the amount of heat generated by these devices. In order to adequately cool these higher powered integrated circuit devices, integrated circuit cooling devices with greater cooling capacities are required.

Conventionally, the cooling capacity of fan assisted heat sink cooling devices has been increased by making the devices larger. Specifically, cooling devices are often made larger by the incorporation of larger heat sinks and larger fans. This increase in size, however, has been found to present a problem in that increasing the size of the cooling device in a vertical direction (i.e. in a direction transverse to the orientation of the integrated circuit device) is often impractical or impossible because of the limited envelope available in many applications, such as in the computer case of a desktop personal computer.

Increasing the size of the cooling device in a horizontal direction (i.e. in a direction parallel to the orientation of the circuit board) is also often a problem because this limits the number of integrated circuit devices (and other electronic devices) which may be incorporated into the computer case.

Another problem with fan assisted heat sink cooling devices is the noise generated by the fans, particularly in situations where larger and/or higher speed fans are used to achieve increased cooling capacity. This is particularly a problem in desktop computers where a user is commonly in close proximity to the machine. The problem is further aggravated in situations where multiple integrated circuit devices, and, thus, multiple cooling devices, are mounted in the same computer case, as occurs in many high power computers.

Thus, it would be generally desirable to provide an apparatus which overcomes these problems associated with heat sink devices.

SUMMARY OF THE INVENTION

The present invention is directed to a heat sink device which provides a large surface area in order to facilitate heat transfer into the surrounding air and which also allows cooling air to impinge directly upon the integrated circuit device being cooled. In this manner, the heat sink device cools the integrated circuit device in two ways: by conducting heat away from the integrated circuit device, and by allowing cooling air to directly cool the integrated circuit device.

The heat sink device is constructed having a relatively large central region which is adapted to contact the integrated circuit device. This large central region facilitates conduction of heat from the integrated circuit device into the heat sink device. Extending outwardly from the central region are a plurality of cooling fins which facilitate the conduction of heat out of the central region and which provide a large surface area to enhance heat transfer into the surrounding air.

A fan may be mounted directly on top of the heat sink device in order to provide a cooling air flow over the radial cooling fins and assist in the removal of heat from the heat sink device. The configuration of the heat sink device allows this cooling air, after flowing over the cooling fins, to impinge directly upon the underlying integrated circuit device in order to directly cool the integrated circuit device.

DETAILED DESCRIPTION OF THE INVENTION

Figures 1, 2:
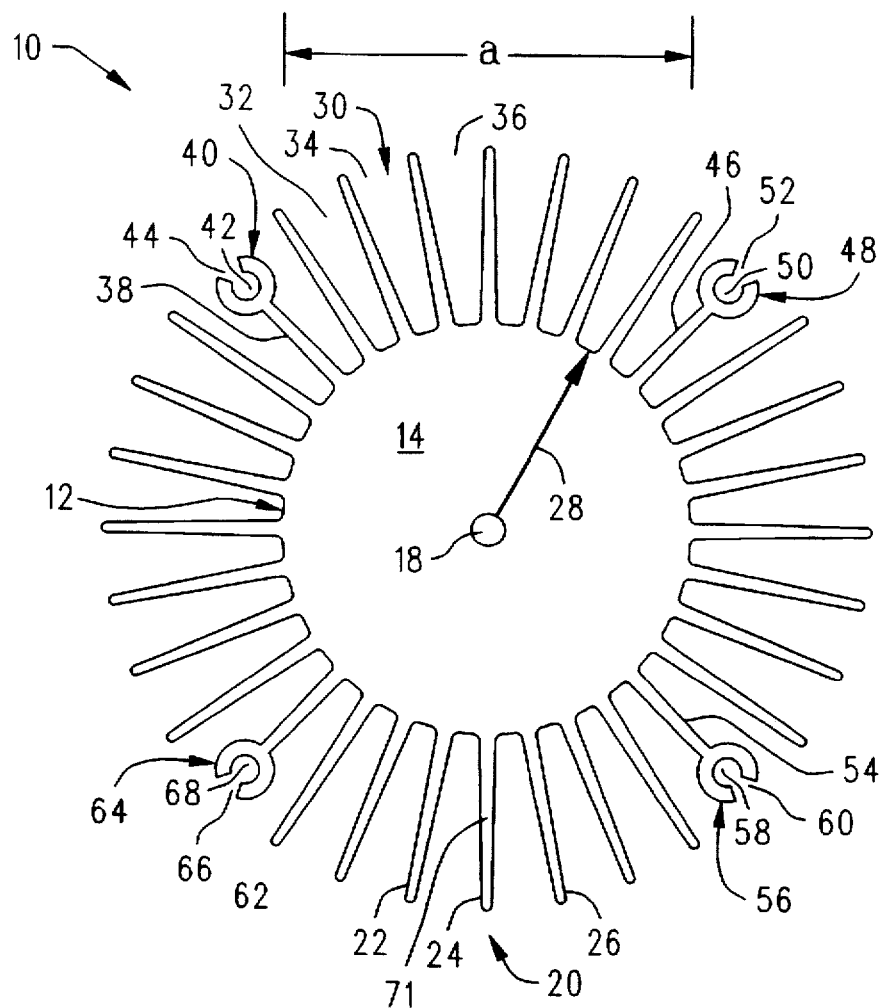
FIG. 1 is a top plan view of a heat sink device.
FIG. 2 is a side elevation view of the heat sink device of FIG. 1.

FIGS. 1–6, in general, illustrate a cooling apparatus 10 for dissipating heat from an electronic device 100. The cooling apparatus 10 may include a heat sink device having a central base portion 12 having a first surface 16 adapted to contact an exterior portion of the electronic device 100; a plurality of heat members 20 extending generally radially outwardly from the central base portion 12; and a plurality of air flow paths 30 extending generally radially from the central base portion 12 and defined by the plurality of heat conducting members 20.

FIGS. 1–6 also illustrate, in general, a heat sink device 10 for dissipating heat from an electronic device 100. The heat sink device 10 may include a central base portion 12 having a first substantially planar contact surface 16 adapted to contact an exterior portion of the electronic device 100; a plurality of elongated heat conducting members 20 extending generally radially from the central base portion 12. The heat conducting members 20 include a first surface 25 which is substantially coplanar with the central base portion contact surface 16.

Having thus described the heat sink device 10 in general, the device will now be described in further detail.

FIGS. 1 and 2 illustrate a radial heat sink device 10 having a solid central region 12. Central region 12 may also have a generally cylindrically shaped structure having an upper surface 14. Central region 12 also has a lower surface 16, FIG. 2, which may be substantially identical to the upper surface 14. A hole 18 may be centrally located in the central region 12, as shown, and may extend completely through the solid central region 12, connecting the central region upper and lower surfaces 14, 16. Hole 18 may be provided with threads in a conventional manner for purposes as will be discussed in more detail herein. Central region 12 may have a diameter "a" of about 34 mm. Referring to FIG. 2, it can be seen that the heat sink device 10 may have an overall diameter "b" of about 80 mm and a height "c" of about 9 mm.

Referring to FIG. 1, a plurality of cooling fins 20, such as the individual fins 22, 24 and 26, may extend radially outwardly from the heat sink device central region 12. The cooling fins 20 define a plurality of generally wedge-shaped spaces 30, such as the individual spaces 32, 34, 36, each of which is located between two adjacent fins 20. Although the heat sink device 10 has been illustrated having thirty-two fins, any number of fins could alternatively be used depending upon the desired heat transfer characteristics desired.

Some of the fins 20, such as the individual fins 38, 46, 54 and 62, may terminate in connectors, such as the connectors 40, 48, 56 and 64, respectively, FIG. 1. Each of the connectors 40, 48, 56 and 64 may have a generally annular shape and may include a threaded opening 42, 50, 58, 68, respectively. The threaded openings 42, 50, 58, 68 may be provided to facilitate the attachment of a fan assembly 150, FIG. 3, to the heat sink device 10 as will be explained in further detail. Each connector 40, 48, 56, 64 may also include a gap, such as the gaps 44, 52, 60 and 66, respectively. The gaps 44, 52, 60 and 66 result in the connector annular wall portions assuming a "c"-shaped configuration as shown in FIG. 1. The gaps 44, 52, 60 and 66 may be provided to facilitate formation of the heat sink device 10 by an extrusion method, as will be explained in more detail herein. When other manufacturing methods, such as casting, e.g., are employed, the gaps 44, 52, 60 and 66 may be omitted. It is noted that, although the heat sink device 10 is shown in the drawing figures having four connectors 40, 48, 56, 64, a larger or smaller number may alternatively be used to facilitate attachment of the fan 150. Heat sink device 10 may be constructed of aluminum or copper or of any other material which adequately conducts heat.

Figure 3:
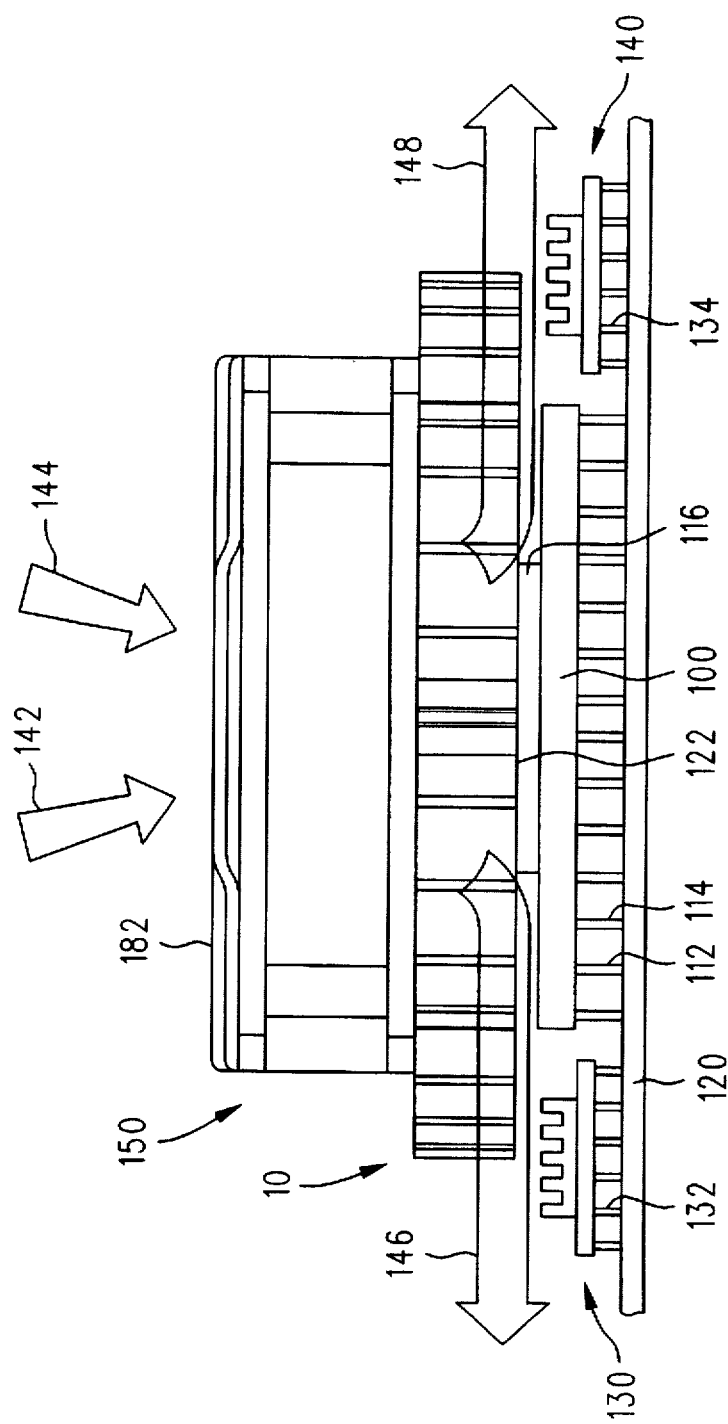
FIG. 3 is side elevation view of the heat sink device of FIG. 1, along with an associated cooling fan, mounted on an integrated circuit device to be cooled.

FIG. 3 illustrates the heat sink device 10 mounted for use in a typical component cooling application. In the example shown, a component 100 is mounted on a PC board 120. Component 100 may be, for example, a processor such as a central processing unit for use in personal computer and work station applications. Component 100 may be mounted to the PC board 120 via electrical connectors, such as the connectors 112, 114 in a conventional manner. In order to facilitate heat dissipation, component 100 may be provided with a lid 116 which is formed from a heat conductive material such as copper in a conventional manner.

Auxiliary components, such as those illustrated by the auxiliary components 130, 140, are often located in close proximity to primary components such as the primary component 100. Such auxiliary components may be mounted to the PC Board 120 as shown, for example by the connectors 132, 134 in a conventional manner.

During operation, electronic components such as the components 100, 130, 140 generate significant amounts of heat. This is particularly true with recently developed more powerful components such as many of the computer processors currently in use. In order to keep such components operating at peak efficiency and to avoid damage, overheating of the components must be avoided. To prevent such overheating, it is necessary to remove sufficient heat from the components during operation.

To accomplish heat removal from the primary component 100, the heat sink device 10 may be mounted directly on top of the component lid 116 so that the lower surface 16 of the heat sink device central region 12 is in contact with the upper surface of the component lid 116, forming a joint 122 therebetween. In this manner, heat generated by the component 100 may be conducted through the component lid 116 and into the heat sink device central region 12. To facilitate heat transfer across the joint 122, a heat conductive substance, such as a heat conductive grease, may be applied between the lid 116 and the lower surface 16 of the heat sink device central region 12 in a conventional manner.

Heat sink device 10 may be securely fastened to the electronic component 100 by the use of a threaded stud, not shown, which is attached to and extends upwardly from the surface of the electronic component lid 116. The threaded stud may engage the threaded hole 18 in the heat sink device 10, FIG. 1, in order to fasten the heat sink device 10 to the electronic component 100. In this manner, the heat sink device 10 may be spun onto the electronic component threaded stud until the lower surface 16 of the heat sink device central region 12 tightly engages the upper surface of the electronic device lid 116 as shown in FIG. 3. As an alternative to the use of a threaded stud, the heat sink device 10 may be attached to the electronic component 10 in any conventional manner.

Figure 4:
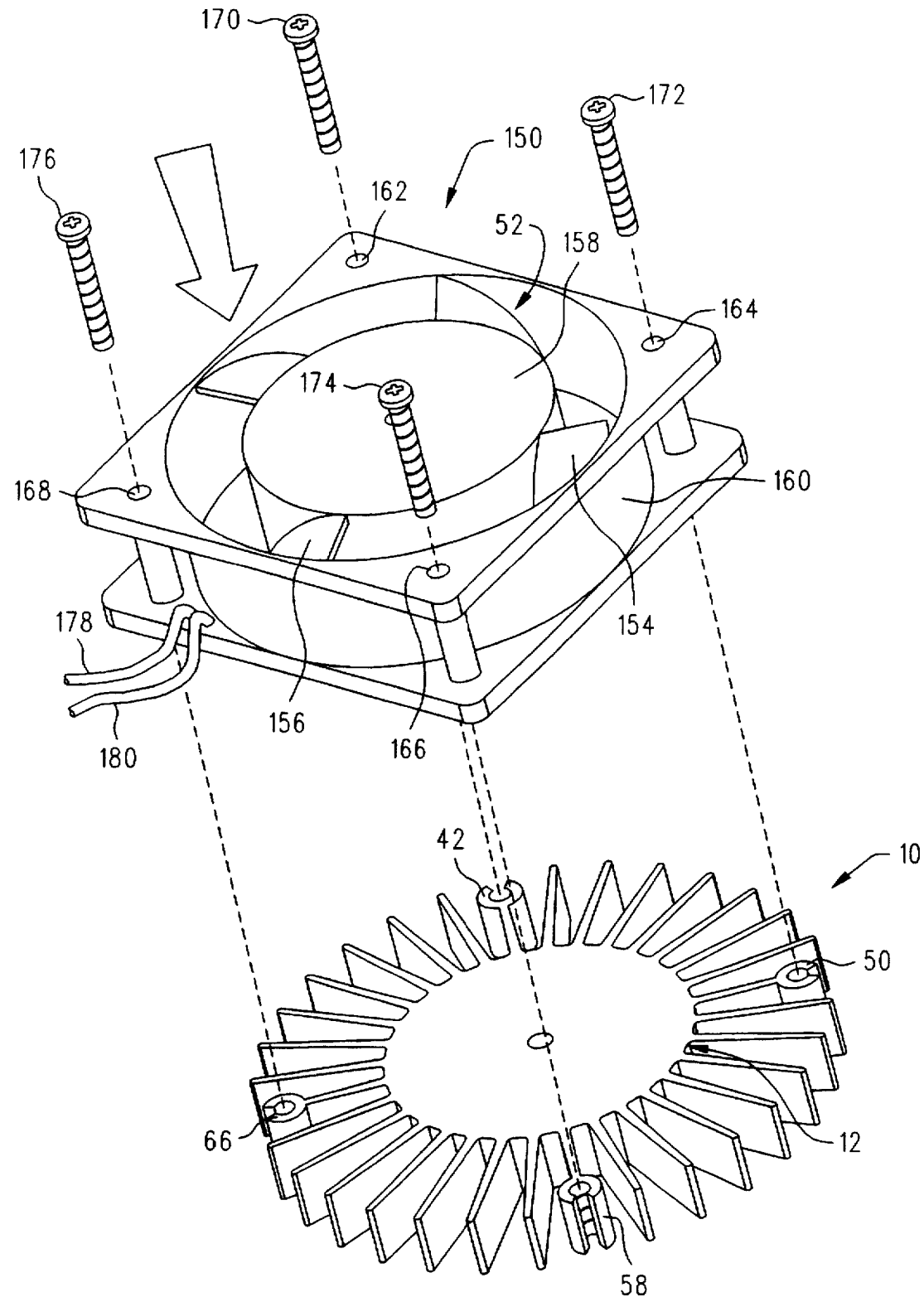
FIG. 4 is a top perspective exploded view showing the manner in which the cooling fan of FIG. 3 may be attached to the heat sink device of FIG. 1.

Referring again to FIG. 3, a fan 150 may be mounted above the heat sink assembly 10 as shown. With reference to FIG. 4, it can be seen that the fan 150 may include a plurality of fan blades 152, such as the individual fan blades 154, 156. It is noted that, although for the sake of clarity, the fan 150 is illustrated in FIG. 3 as having four fan blades, the fan 150 may actually have a greater or lesser number of blades. The fan 150 may, for example have eleven blades.

The fan blades 152 may be mounted to a hub section 158 in a conventional manner. The hub section 158, in turn, is rotatably mounted within a fan housing 160. The fan 150 may be powered, in a conventional manner by an electric motor. A pair of electrical leads 178, 180 may be provided to supply power to the fan electric motor, also in a conventional manner. The motor may, for example, be a 12 volt DC brushless type motor. The fan, for example, may be of the type commercially available from Matsushita Electric Company of Japan and sold as Model No. FBA06T12H.

To facilitate attachment of the fan 150 to the heat sink device 10, the fan housing 160 may be provided with a plurality of through-holes 162, 164, 166, 168 as shown. In order to attach the fan 150 to the heat sink device 10, a plurality of bolts or screws 170, 172, 174, 176 may be passed through the fan through-holes 162, 164, 166, 168 and engaged with the heat sink threaded openings 42, 50, 58, 66, respectively. The fan may also optionally be provided with a grill 182, FIG. 3, in order to prevent the entry of foreign objects into the fan 150 during operation. When used, the grill 182 may be secured with the bolts or screws 170, 172, 174, 176 as previously described or, alternatively, may be secured in any conventional manner.

As described above with reference to FIG. 3, the lower surface 16 of the heat sink assembly central region 12 may be tightly secured against the upper surface of the component lid 116, thus facilitating heat transfer between the two surfaces. Accordingly, during operation of the component 100, heat is drawn away from the component and into the heat sink central region 12.

For efficient cooling, the heat, after being transferred into the heat sink central region 12, must be further transferred into the cooling fins 20 and then into the surrounding air. The ability of a heat sink device, such as heat sink device 10, to transfer heat into the air depends, among other things, upon the amount of surface area of the heat sink device exposed to the surrounding air. The cooling fins 20 facilitate such heat transfer by effectively increasing the surface area of the heat sink device 10.

In operation, fan 150 may be activated in order to cause air movement in the general direction of the arrows 142, 144, FIG. 3. Specifically, air will be forced downwardly in the direction of arrows 142, 144, and flow through the gaps 30 and over the heat sink cooling fins 20. Because the bottom of the heat sink device 10 is open, the air will then impinge directly upon the primary electronic component 100 and the auxiliary components 130, 140. At this point, the air is forced to assume a more horizontal flow pattern generally illustrated by the arrows 146, 148.

As can be appreciated from the above description of the operation of the heat sink device 10, air entering the heat sink device first passes over the heat sink device cooling fins 20 in order to remove heat which has conducted into the fins from the heat sink central region 12. After passing over the fins, this same air then impinges directly upon the electronic components 100, 130, 140 in order to remove additional heat directly from the components. In this manner, the heat sink device 10 is able to remove heat from electronic components, such as the components 100, 130, 140 in a highly efficient manner.

As can further be appreciated, in operation, heat in the heat sink device central region 12 is conducted into the heat sink device cooling fins 20 in only a radial direction as indicated, for example by the arrow 28 in FIG. 1. This radial heat conduction is enhanced by the fact that the cooling fins 20 are integrally formed with the central region 12. Due to this integral formation, there are no joints or interface surfaces within the heat flow path which might otherwise tend to impair heat conduction. With reference to FIG. 3, it can also be readily appreciated that the airflow within the heat sink device 10 also occurs in a substantially radial direction as indicated by the arrows 146, 148.

Accordingly, the heat sink device 10 is able to cool electronic components, such as the components 100, 130, 140, FIG. 4, in two ways. First, the heat sink device 10 cools the component by conducting heat away from the component into the heat sink device central region 12 and then radially into the cooling fins 20 for transfer into the air flow. Second, the heat sink device 10 causes air to impinge directly upon the electronic component to cause heat removal, with reference to FIG. 4, it is noted that the fan hub 158 represents a "dead spot" within the fan. In other words, no air flow is induced by the fan in an area directly below the hub 158; airflow is only induced in an area below the fan blades 52. Since there is no air movement induced below the hub area, it is not generally beneficial to provide the heat sink cooling fins 20 in this area. Accordingly, the diameter of the heat sink central region 12 may be constructed to approximately correspond to the diameter of the fan hub 158. This arrangement allows the size of the heat sink central region 12 to be maximized without any significant reduction in useful cooling fin surface area. This increased size of the heat sink central region 12 results in a larger contact surface area between the electronic component 100 and the heat sink device 10 which improves heat transfer between the two. The increased size of the heat sink central region also results in the central region having an increased mass, which improves heat conduction into the central region and away from the electronic component 100.

Figure 5:
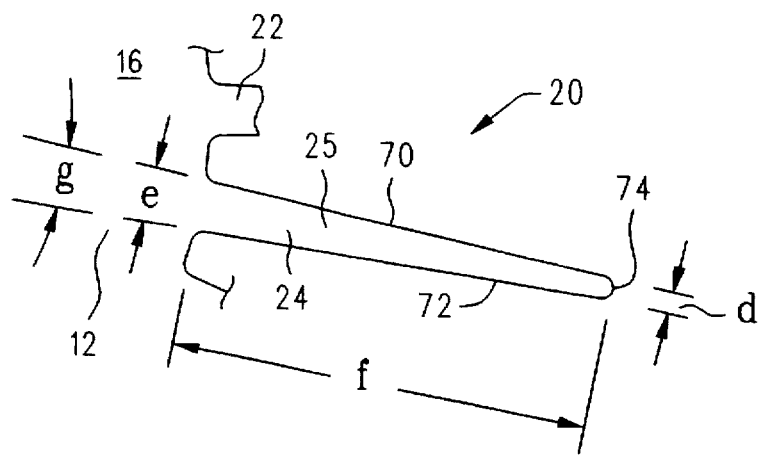
FIG. 5 is a bottom plan detail view of one of the cooling fins of the heat sink device of FIG. 1.

Referring to FIG. 5, it can be seen that each of the cooling fins 20 may be tapered. Specifically, with reference to the cooling fin 24 in FIG. 5, it can be seen that each fin may have outer surfaces 70 and 72 which taper at an angle "g" of about 2 degrees to a radiused point 74. Each fin 20 may also have a length "f" of about 23 mm and an inside thickness "e", adjacent the heat sink central region 12, of about 1.8 mm. Accordingly, each fin may have an outside thickness "d", opposite the heat sink central region 12, of about 1 mm.

The taper described above allows the heat sink device 10 to operate in an extremely efficient manner. As can be appreciated, during operation, the heat sink device fins 20 will have the highest temperature at a location immediately adjacent the heat sink device central region 12, e.g., FIG. 1. The temperature of the fin will decrease toward the outer tip 74 of the fin, FIG. 5. This temperature gradient is due to the fact that heat originates in the central region 12 and then conducts radially outwardly trough the fins 20. The fin taper described above causes a greater mass of fin material to be located at regions which are closer to the central region 12 and which, thus, are required to conduct a greater amount of heat. This greater mass of material enhances heat conduction in these areas. The fin taper also provides for more fin surface area in regions close to the central region 12 and, thus, facilitates the efficient transfer of heat from the fins into the surrounding air.

Referring again to FIG. 5, it can be seen that each of the cooling fins 20 has a lower surface, such as the lower surface 25 of the fin 24. As can be seen from FIGS. 2 and 5, the lower surface of each of the fins 20 is coplanar with the heat sink central region lower surface 16. Referring to FIG. 1, it can be seen that each of the fins 20 also have an upper surface, such as the upper surface 71 of the fin 24. As can be seen from FIG. 2, the upper surface of each of the fins 20 is coplanar with the heat sink central region upper surface 14.

The heat sink device 10, as described above, may be constructed in any conventional manner such as by die casting or investment casting processes. In a preferred method, however, the heat sink device 10 may be formed by an extrusion process. In this process, an elongated structure having a cross-section identical to that shown in FIG. 1, may be extruded. After extrusion, the elongated structure may be cut into a plurality of sections, each having a thickness equal to the desired height "c", FIG. 2, of the heat sink device. After cutting into sections, the threaded hole 18 may be provided in the central region 12 and the connector openings 42, 50, 58 and 66 may be provided with threads in a conventional manner. Alternatively, the threaded hole 18 and the threads in the connector openings 42, 50, 58 and 66 may be provided before cutting the elongated extruded structure into sections.

Figure 6:
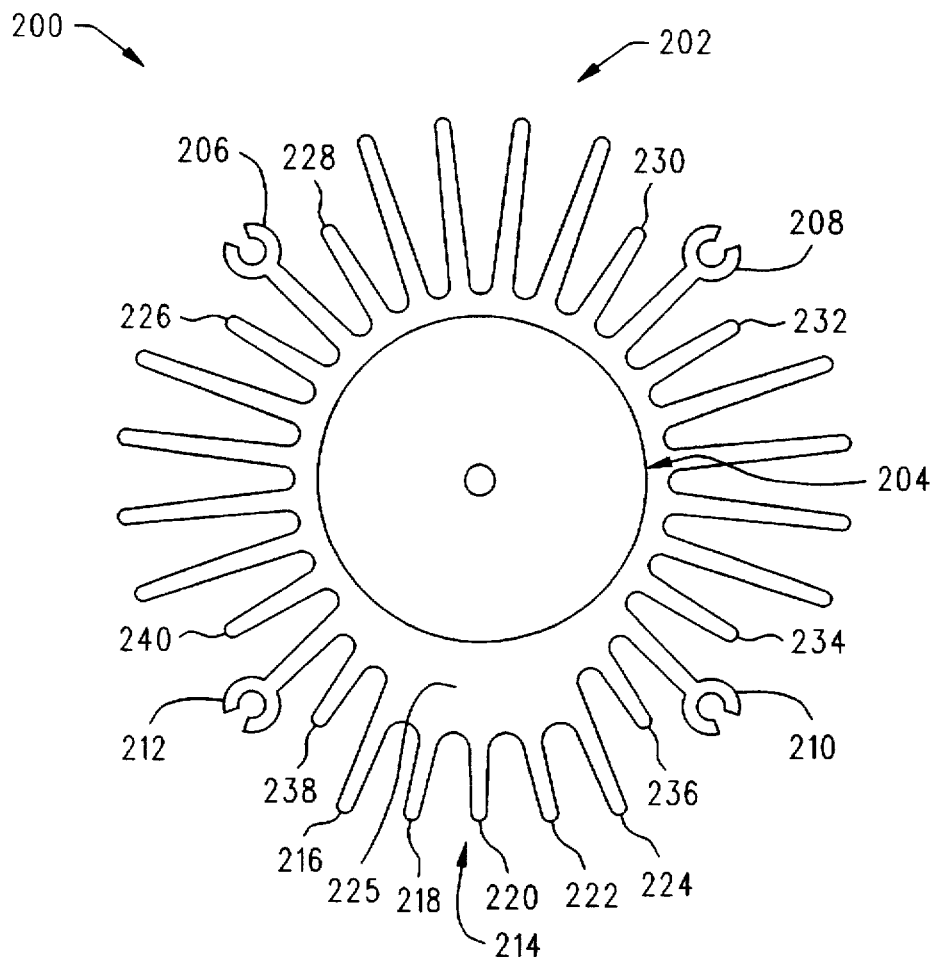
FIG. 6 is a top plan view of an alternative embodiment of a heat sink device.

When an extrusion process is used, the heat sink device may be provided with a configuration which is more conducive to extruding, such as the configuration shown in FIG. 6. Referring to FIG. 6, it can be seen that the heat sink device 200 includes a plurality of cooling fins 202 which extend radially outwardly from a central region 204 in a similar manner to the heat sink device 10. The heat sink device 200 may also be provided with connectors 206, 208, 210 and 212 which may be identical to the connectors 40, 48, 56 and 64 of the heat sink device 10 in order to facilitate attachment of a fan in a manner as previously described.

The heat sink device 200 may, however, be provided with a reduced number of cooling fins, e.g., twenty-nine, in order to facilitate an extrusion process. The heat sink device 200 may also be provided with a flattened area 214 which serves to support the elongated extruded structure as it exits the extrusion die. Flattened area 214 may be formed of a plurality of fins of appropriate length, such as the fins 216, 218, 220, 222, 224. A mass of material may also be left in an area 225 located radially inwardly of the fins 216, 218, 220, 222, 224 in order to facilitate the extrusion process.

In order to provide greater clearance in the extrusion die, the cooling fins immediately adjacent the connectors 206, 208, 210, 212 may be shortened as shown in FIG. 6. Specifically, shortened fins 226 and 228 may be provided adjacent the connector 206, shortened fins 230 and 232 may be provided adjacent the connector 208, shortened fins 234 and 236 may be provided adjacent the connector 210 and shortened fins 238 and 240 may be provided adjacent connector 212. in all other aspects, the heat sink device 200 of FIG. 6 may be identical to the previously described heat sink device 10.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling apparatus for dissipating heat from an electronic device, comprising:

a heat sink device including
      a central base portion having a first surface adapted to contact an exterior portion of said electronic device;
      a plurality of heat conducting members extending generally radially outwardly from said central base portion; and
      a plurality of air flow paths extending generally radially from said central base portion and defined by said plurality of heat conducting members;
      wherein said plurality of heat conducting members each have a first end connected to said central base portion and a second terminal end opposite said first end which is unconnected to said central base portion;
      wherein said first end and said second terminal end define a heat conducting member length therebetween and said length of one of said plurality of heat conducting members is different from said length of at least one other of said plurality of heat conducting members; and
      wherein said central base portion includes a threaded hole therein.

2. The cooling apparatus of claim 1 further including an air movement mechanism adjacent said heat sink device.

3. The cooling apparatus of claim 2 wherein said heat sink device includes a second surface opposite said first surface.

4. The cooling apparatus of claim 3 wherein said air movement mechanism is attached to said heat sink device adjacent said second surface.

5. The cooling apparatus of claim 1 wherein said plurality of heat conducting members each includes a heat conducting member first surface which is substantially coplanar with said central base portion first surface.

6. The cooling apparatus of claim 5 wherein said plurality of heat conducting members each further include:
   a. a second heat conducting member surface adjacent and extending transversely to said first heat conducting member surface;
   b. a third heat conducting member surface adjacent and extending transversely to said first heat conducting member surface;
   c. a fourth heat conducting member surface adjacent both said second and third heat conducting member surfaces.

7. The cooling apparatus of claim 1 wherein a threaded hole is provided at said second terminal end of at least one of said plurality of heat conducting members.

8. The cooling apparatus of claim 7 further including an air movement device attached to said heat sink device by a threaded member which is engaged in said threaded hole.

9. The cooling apparatus of claim 1 wherein said central base portion is integrally formed with said plurality of heat conducting members.

10. A heat sink device for dissipating heat from an electronic device, comprising:

a central base portion having a first substantially planar contact surface adapted to contact an exterior portion of said electronic device;
   a plurality of elongated heat conducting members extending generally radially from said central base portion, each of said heat conducting members including a first surface which is substantially coplanar with said central base portion contact surface; and
   wherein a threaded hole is provided at said second terminal end of at least one of said plurality of elongated heat conducting members.

11. The heat sink device of claim 10 wherein said plurality of elongated heat conducting members each further include:
   a. a second surface adjacent and extending transversely to said first surface;
   b. a third surface adjacent and extending transversely to said first surface;
   c. a fourth surface adjacent both said second and third surfaces.

12. The heat sink device of claim 10 wherein said plurality of elongated heat conducting members each have a first end connected to said central base portion and a second terminal end opposite said first end which is unconnected to said central base portion.

13. The heat sink device of claim 12 wherein said first end and said second terminal end define a heat conducting member length therebetween and said length of one of said plurality of elongated heat conducting members is different said length of at least one other of said plurality of elongated heat conducting members.

14. The heat sink device of claim 10 wherein said central base portion includes a threaded hole therein.

15. The cooling apparatus of claim 10 wherein said central base portion is integrally formed with said plurality of heat conducting members.

* * * * *